US005952878A

United States Patent [19]

Wu et al.

[11] Patent Number: 5,952,878
[45] Date of Patent: Sep. 14, 1999

[54] SECOND ORDER DIFFERENTIAL HIGHPASS FILTER

[75] Inventors: Chien-Ping Wu; Chang-Da Tsai; Shiao-Long Zhan, all of Taipei, Taiwan

[73] Assignee: National Science Council, Taipei, Taiwan

[21] Appl. No.: 09/009,786

[22] Filed: Jan. 20, 1998

[30] Foreign Application Priority Data

Jan. 23, 1997 [TW] Taiwan ................................. 86100743

[51] Int. Cl.[6] .............................. H03K 5/00; H03B 1/04
[52] U.S. Cl. ......................... 327/559; 322/561; 322/552; 330/109; 330/303; 330/107
[58] Field of Search .................... 327/552, 559, 327/311, 561, 336, 345, 344, 553; 330/107, 109, 303

[56] References Cited

U.S. PATENT DOCUMENTS 3,787,774  1/1974  Tietze et al. ............................. 328/167
4,494,551  1/1985  Little, III et al. ........................ 327/553

OTHER PUBLICATIONS

H.W. Smit, K. Verton and C.A. Grimbergen, "A Low–Cost Multichannel Preamplifier for Physiological Signals", IEEE Transactions on Biomedical Engineering, Vol. BME–34, No. 4, Apr. 1987, pp. 307–310.

*Primary Examiner*—Dinh T. Le
*Attorney, Agent, or Firm*—Hitt Chwang & Gaines, P.C.

[57] ABSTRACT

A second-order differential highpass filter constructed according to the present invention includes a difference amplifier and a feedback processing circuit. The difference amplifier includes an operational amplifier $OP_1$, and four resistors $R_3$, $R_4$, $R_5$ and $R_6$, wherein $R_4/R_3=R_6/R_5$. An input voltage $V_1$ is fed to the inverting terminal (−) of the operational amplifier $OP_1$ via the resistor $R_5$. Another input voltage $V_2$ is fed to the noninverting terminal (+) of the operational amplifier $OP_1$ via the resistor $R_3$. The output of the operational amplifier $OP_1$ is fed back to the inverting terminal (−) of the operational amplifier $OP_1$ via the resistor $R_6$. The feedback processing circuit includes an operational amplifier $OP_2$, two resistors $R_1$ and $R_2$, and two serial capacitors $C_2$ and $C_1$. The output of the operational amplifier $OP_2$ is fed back to the inverting terminal (−) of the operational amplifier $OP_2$ via the two serial capacitors $C_1$ and $C_2$, and is connected to the noninverting terminal of the operational amplifier $OP_1$ via the resistor $R_4$, and the noninverting (+) terminal of the operational amplifier $OP_2$ is grounded. The inverting terminal of the operational amplifier $OP_2$ is connected to the output terminal of the operational amplifier $OP_1$ via the resistor $R_1$. The two serial capacitors $C_1$ and $C_2$ are connected therebetween to one terminal of the resistor $R_2$ of which another terminal is grounded.

2 Claims, 5 Drawing Sheets

5,952,878

SECOND ORDER DIFFERENTIAL HIGHPASS FILTER

FIELD OF THE INVENTION

The present invention is related to a differential highpass filter, and in particular to a second-order differential highpass filter which is able to remove low-frequency signal with attenuation of −40 dB/decade and has a differential gain as well.

BACKGROUND OF THE INVENTION

Filters are almost inevitably required for electrical signals processing. In human body, there are many diagnosis-valued signals which are presented as differential signal, e.g. electrocardiogram, and electroencephalogram, etc.. However, upon recording these physiological signals the measured signals are often corrupted by low-frequency interference. The interferences are caused by the respiration and motion of the subject as well as the differential dc voltage due to the polarization of the electrodes. As a result, the measured signals are degraded or the physiological interpretations are disrupted. Thus, suppressing the low-frequency interferences become important and is the first step in the preprocessing of physiological signals.

In the literature, there are many excellent digital signal processing techniques to remove the low-frequency interference. When the magnitude of the low-frequency interference is large, the resolution of signals in analog-to-digit conversion is limited, and the converted data have not enough precision for physiological interpretations. Hence, the interference should be attenuated by an analog highpass filter before performing analog-to-digit conversion. A novel idea to solve the precision-limited problem is to consider an additional highpass filtering function in a preamplifier. Several circuits which feed the output signals back to the input stage via the integrating network have been developed to realize this idea. However, the integrating network only forms a first-order highpass filter in the preamplifier. The first-order highpass filter filter having an attenuation of −20 dB/decade is not good enough to suppress the high-intensity low-frequency interference. In order to obtain a desired better suppression of unwanted interference, a new circuit is presented in this invention for the realization of a second-order differential highpass filter.

SUMMARY OF THE INVENTION

A second-order differential highpass filter constructed according to the present invention comprises a difference amplifier and a feedback processing circuit. The difference amplifier comprises an operational amplifier $OP_1$, and four resistors $R_3$, $R_4$, $R_5$ and $R_6$, wherein $R_4/R_3=R_6/R_5$. An input voltage $V_1$ is fed to the inverting terminal (−) of the operational amplifier $OP_1$ via the resistor R5. Another input voltage $V_2$ is fed to the noninverting terminal (+) of the operational amplifier $OP_1$ via the resistor $R_3$. The output of the operational amplifier $OP_1$ is fed back to the inverting terminal (−) of the operational amplifier $OP_1$ via the resistor $R_6$. The feedback processing circuit comprises an operational amplifier $OP_2$, two resistors $R_1$ and R2, and two serial capacitors $C_2$ and $C_1$. The output of the operational amplifier $OP_2$ is fed back to the inverting terminal (−) of the operational amplifier $OP_2$ via the two serial capacitors $C_1$ and $C_2$, and is connected to the noninverting terminal of the operational amplifier $OP_1$ via the resistor $R_4$, and the noninverting (+) terminal of the operational amplifier OP2 is grounded. The inverting terminal of the operational amplifier OP2 is connected to the output terminal of the operational amplifier $OP_1$ via the resistor $R_1$. The two serial capacitors $C_1$ and $C_2$ are connected therebetween to one terminal of the resistor $R_2$ of which another terminal is grounded.

BRIEF DESCRIPTION OF THE DRAWINGS

The foregoing and other objects, aspects and advantages will be better understood from the following detailed description of the preferred embodiments of the invention with reference to the accompanying drawings wherein like numerals represent like elements and in which.

DETAILED DESCRIPTION OF THE PREFERRED EMBODIMENTS

Figure 1:
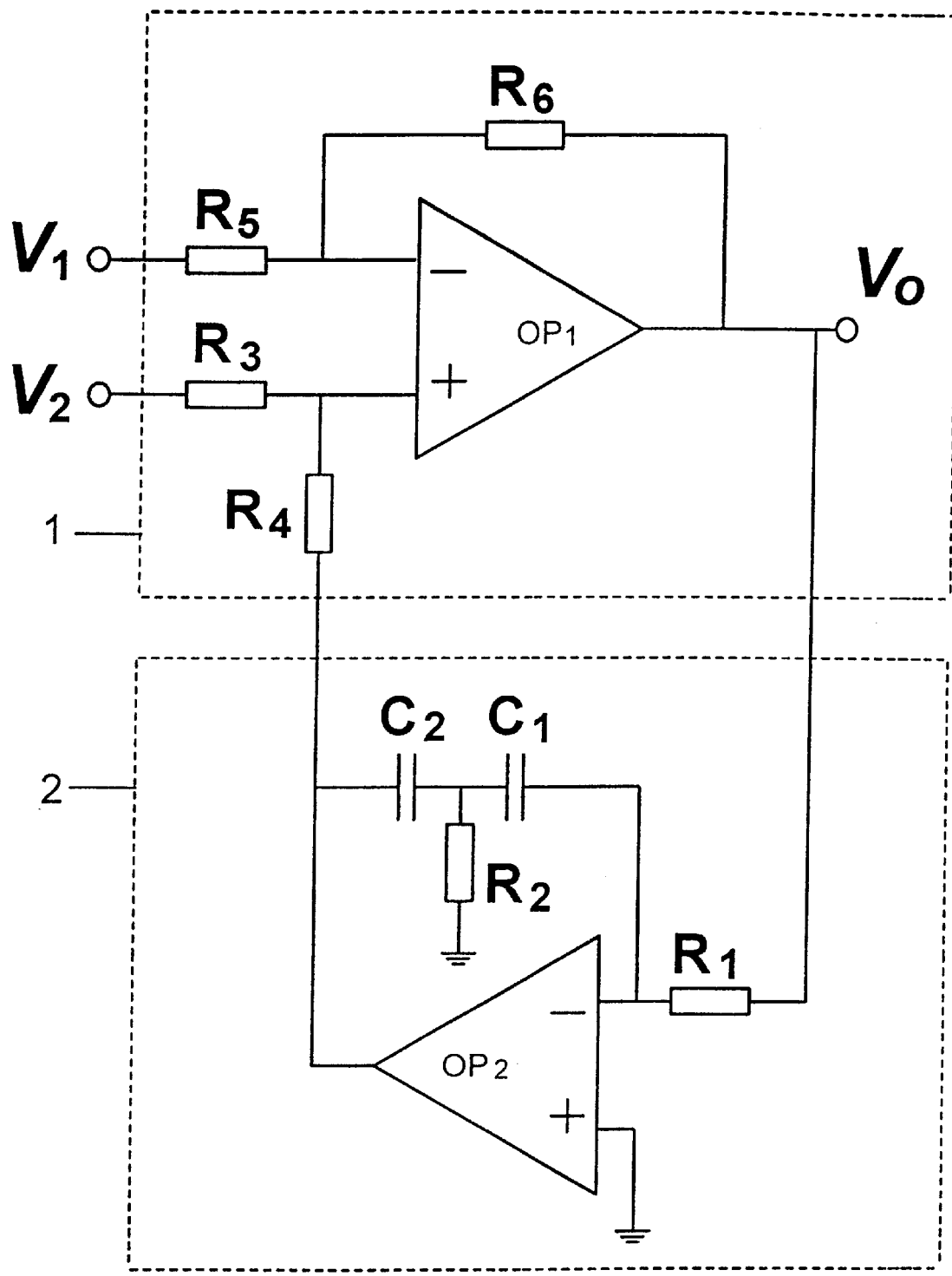
FIG. 1 shows a block diagram of a second-order differential highpass filter constructed according to the present invention.

A second-order differential highpass filter is disclosed in the present invention, which comprises a difference amplifier (1) and a feedback processing circuit (2) as shown in FIG. 1.

The difference amplifier (1) includes an operational amplifier $OP_1$ and four resistors $R_3$, $R_4$, $R_5$, and $R_6$, wherein $R_4/R_3=R_6/R_5$. The resistors $R_5$ and $R_3$ are connected to the inverting terminal (−) and the noninverting terminal (+) of the operational amplifier $OP_1$, respectively, so that an input voltage $V_1$ is able to be fed to the inverting terminal (−) of the operational amplifier $OP_1$ via the resistor $R_5$ and another input voltage $V_2$ is able to be fed to the noninverting terminal (+) of the operational amplifier $OP_1$ via the resistor $R_3$. The output terminal of the operational amplifier $OP_1$ is connected to the inverting terminal of the operational amplifier $OP_1$ with the resistor $R_6$ to form a feedback configuration. An output voltage $V_0$ resulting from the differential signal $V_2-V_1$ is thus obtained from the output terminal of the operational amplifier $OP_1$.

The feedback processing circuit (2) consists essentially of an operational amplifiers $OP_2$, two resistors $R_1$ and $R_2$, and two capacitors $C_1$ and $C_2$, wherein the two capacitors $C_1$ and $C_2$ are connected to each other with a conductive wire in series. The output terminal of the operational amplifier OP2 is connected to the inverting terminal (−) of the operational amplifier OP2 with the the two capacitors $C_2$ and $C_1$ to form a feedback configuration as well as to the noninverting terminal of the operational amplifier $OP_1$ via the resistor $R_4$, and the noninverting terminal (+) of the operational amplifier OP2 is grounded. One terminal of the resistor R2 is connected to the conductive wire connecting the two serial capacitors $C_1$ and $C_2$, and another terminal thereof is grounded. The inverting terminal of the operational amplifier $OP_2$ is connected to the output terminal of the operational amplifier $OP_1$ via the resistor $R_1$.

A. Transfer Function

The structure of the proposed second-order differential highpass filter as illustrated in FIG. 1 comprises two operational amplifiers, two capacitors, and six resistors. After some manipulation, the transfer function F(S) is given by $$F(S) = \frac{V_o}{V_2 - V_1} = K \frac{S^2}{S^2 + \frac{C_1 + C_2}{C_1 C_2 R_1} S + \frac{1}{C_1 C_2 R_1 R_2}} \quad (1)$$

$$= K \frac{S^2}{S^2 + \frac{\omega_o}{Q} S + \omega_o^2} \quad (2)$$

$$\frac{\omega_o}{Q} = \frac{C_1 + C_2}{C_1 C_2 R_1} \quad (3)$$

$$\omega_o^2 = \frac{1}{C_1 C_2 R_1 R_2} \quad (4)$$

where
  Q is quality factor;
  $\omega_0$ is −3 dB frequency;
  K is differential gain;
  $V_0$ is the output voltage of the second-order differential highpass filter;
  $V_1$ and $V_2$ are the input voltage;
  S is parameter of Laplace;
  $R_1$ and R2 are resistors; and
  $C_1$ and C2 are capacitors It is apparent that the proposed filter shown in FIG. 1 is a second-order highpass filter for differential signal with a voltage gain. From the equations (3) and (4), the −3 dB frequency and quality factor of the filter are given by $$\omega_o = \sqrt{\frac{1}{C_1 C_2 R_1 R_2}} \quad (5)$$

$$Q = \frac{1}{C_1 + C_2} \sqrt{\frac{C_1 C_2 R_1}{R_2}} \quad (6)$$

B. Design Procedure

Given the desired specification of $\omega_0$ and Q, the passive components can be determined by the following steps:

step 1: choosing suitable capacitance for $C_1$ and $C_2$;
  step 2: calculating the resistance of $R_1$ by the equation:

$$R_1 = \frac{C_1 + C_2}{C_1 C_2} \frac{Q}{\omega_o}$$

step 3: calculating resistance of $R_2$ as follows:

$$R_2 = \frac{1}{C_1 C_2 R_1 \omega_o^2}$$

The design procedure is very simple and easy to be implemented. It is not necessary to solve difficult quadratic equations, which usually results in complex-value or negative solutions.

C. Implementation by Instrumentation Amplifier

Figure 4:
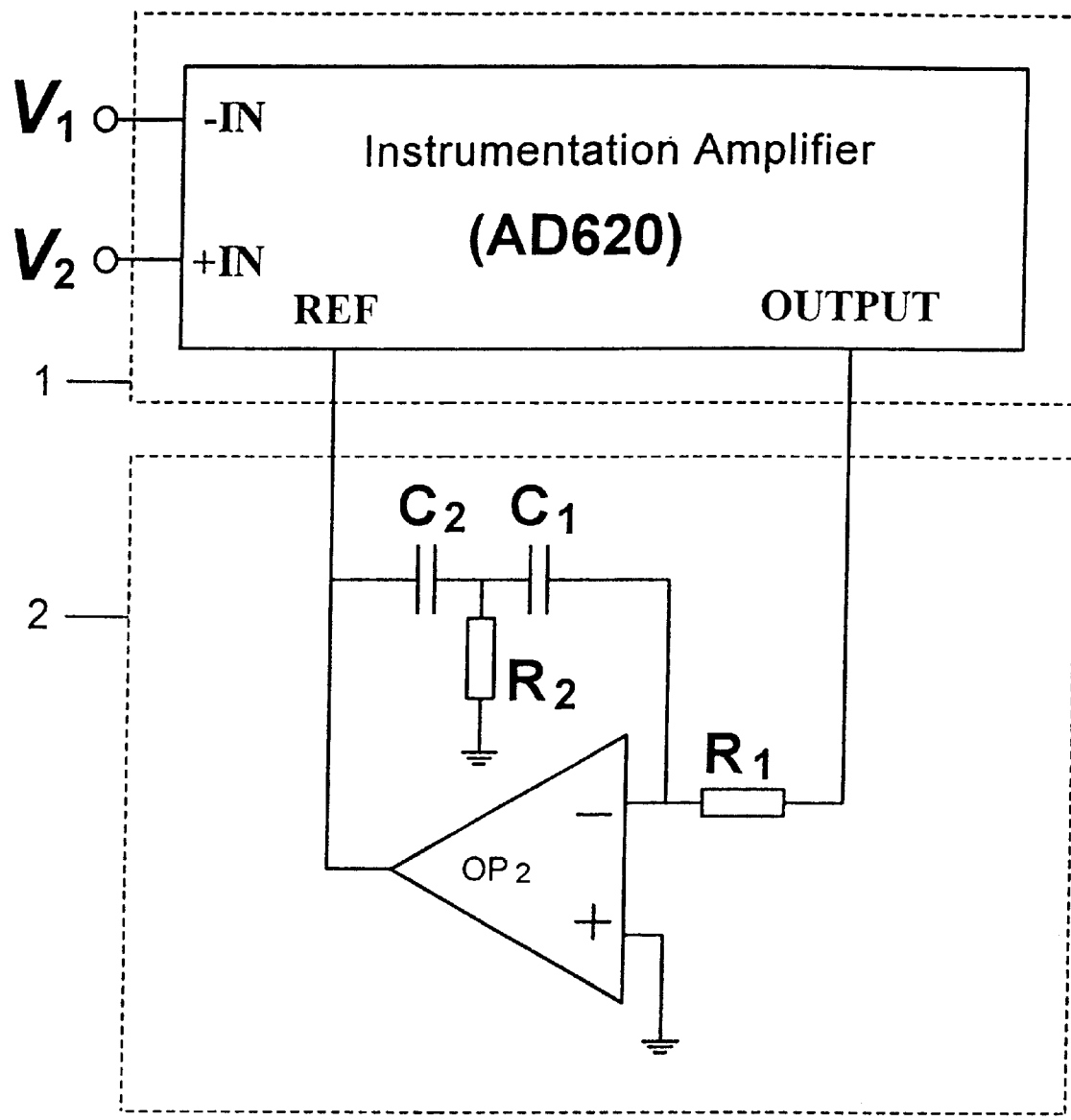
FIG. 4 shows a block diagram of a second-order differential highpass filter of the present invention realized with an instrumentation amplifier.

As shown in FIG. 4, the difference amplifier (1) shown in FIG. 1 can be realized with an instrumentation amplifier AD620 (Analog Devices, U.S.). In addition to the function of second-order highpass filtering, the proposed filter shown in FIG. 4 preserves the main properties of the instrumentation amplifier, e.g. low noises, high input impedance, high CMRR, etc.

The technique of this invention, a second-order differential highpass filter, can be made into a monolithic integrated circuit which functions as a preamplifier with a second-order highpass filter.

D. Results of Computer Simulation

To demonstrate the feasibility of this invention, a second-order differential highpass filter, computer simulation with Pspice software was carried out and described as follows:

Given the desired quality factor Q=0.707, −3 dB frequency $F_0$=100 Hz, capacitors $C_1$=148 nF and $C_1$=123 nF, the two resistance of $R_1$ and $R_2$ can be obtained according to the step 2 and step 3 of the Design Procedure, which are $R_1$=16.75 5 KΩ, $R_2$=8.31 KΩ. Assuming the input voltage $V_1$=1V(ac), $V_2$=2V(ac), and the resistors $R_3$=$R_4$=$R_5$=$R_6$=10 KΩ, the frequency response of the proposed second-order differential highpass filter depicted in FIG. 1 was obtained and shown in FIG. 2 and FIG. 3 by volt and decibel (dB) respectively.

Figure 2:
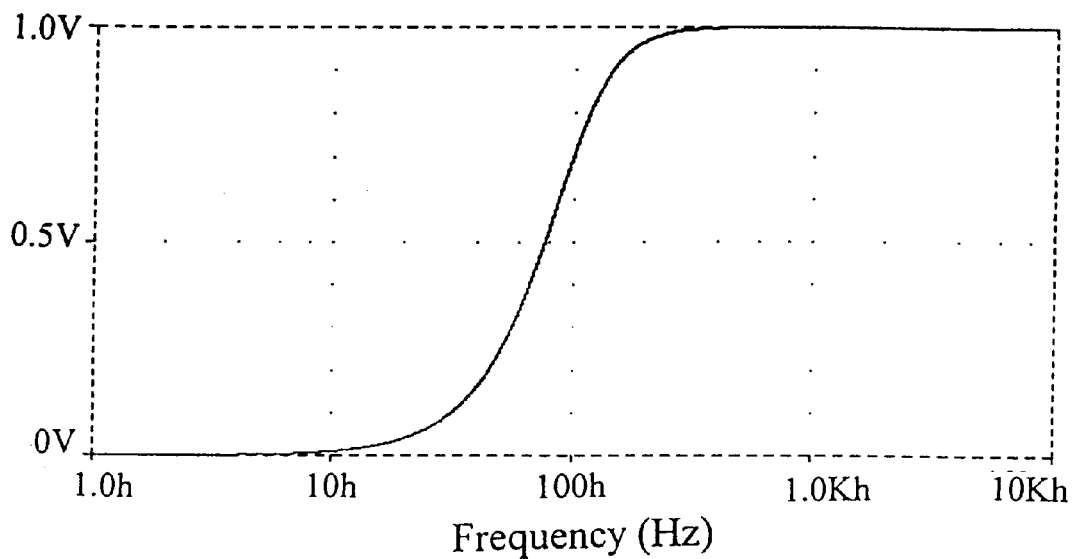
FIG. 2 is a frequency vs. volt plot which shows a simulation of frequency response of the second-order differential highpass filter shown in FIG. 1, wherein the differential input $V_2-V_1=1V$ and −3 dB frequency $F_0=100$ Hz.

The units of horizontal and vertical axes in FIG. 2 are Hertz (Hz) and volt respectively. The output voltage is less than 0.707V if the frequency is less than 100 Hz, and the output voltage decreases as the frequency decreases. When the frequency is higher than 200 Hz, the output voltage is 1V nearly. It is apparent that FIG. 2 is a typical frequency response of a highpass filter.

Figure 3:
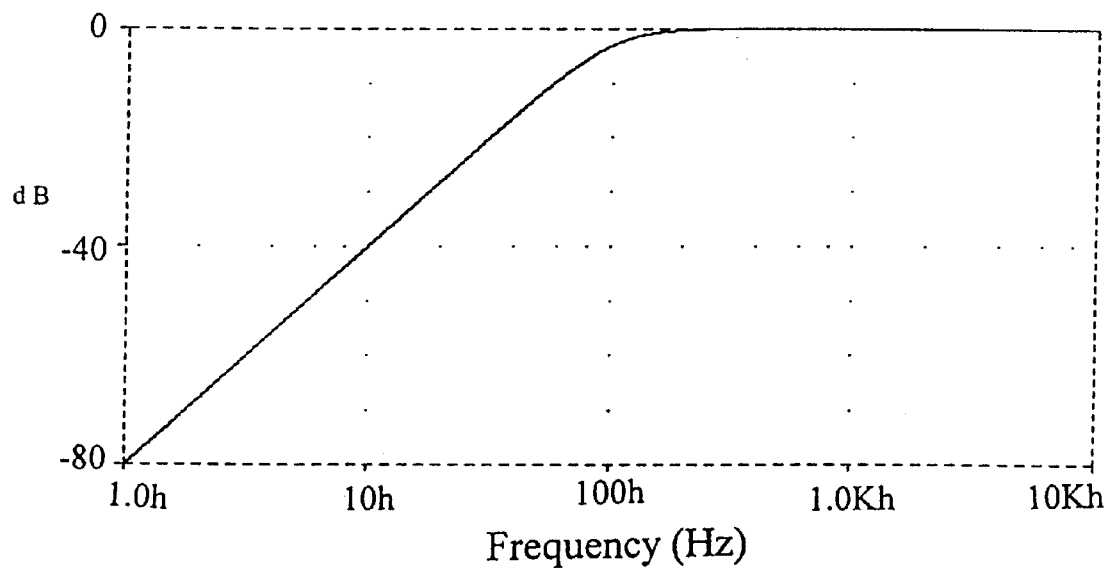
FIG. 3 is a frequency vs. dB plot which shows a simulation of frequency response of the second-order differential highpass filter shown in FIG. 1, wherein the low-frequency suppression is −40 dB/decade.

The units of horizontal and vertical axes in FIG. 3 are Hertz (Hz) and decibel (dB), respectively. The performance of low-frequency suppression is demonstrated by the attenuation of −40 dB/decade. The results of the simulation verify the theoretical analysis and demonstrate the applicability of the second-order differential highpass filter proposed in FIG. 1.

E. Results of Practical Tests

The circuit depicted in FIG. 1 was realized with an instrumentation amplifier AD620 as shown in FIG. 4. The values of the passive elements were the same as those used in the above simulation (quality factor Q=0.707, −3 dB frequency $F_0$, =100 Hz.

Figure 5:
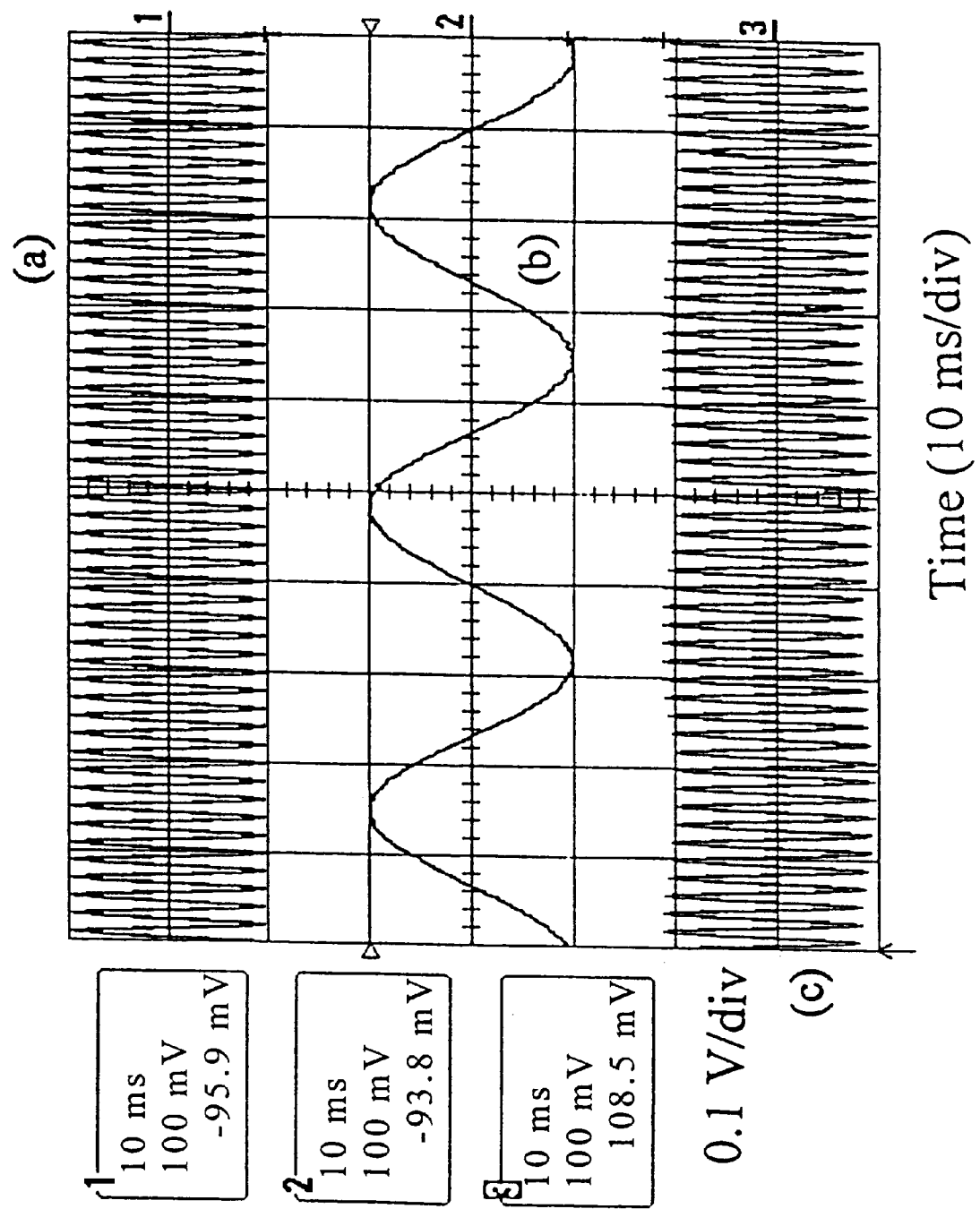
FIG. 5 shows test results of the second-order differential highpass filter shown in FIG. 4, wherein signal (a) is one of the input $V_1=100 \sin 2\pi 500t$ mV; signal (b) is the other input $V_2=100 \sin 2\pi 30t$ mV; and signal (c) is output voltage which can be represented by $-100 \sin 2\pi 500t$ mV.

FIG. 5 shows test results of the second-order differential highpass filter shown in FIG. 4, wherein signal (a) is one of the input $V_1$=100 sin 2π500t mV; signal (b) is the other input $V_2$=100 sin 2π500 t mV; and signal (c) is output voltage which can be represented by −100 sin 27c500t mV with a little sinusoid of 30 Hz. It can be seen from FIG. 5 that the sinusoid signal (signal (b)) with the frequency of 30 Hz has been substantially removed and the phase of the sinusoid signal (signal (a)) has been inverted at the output terminal of the filter (signal (c). The time scale is 10 ms/div and the amplitude scale is 100 mV/div.

Figure 6:
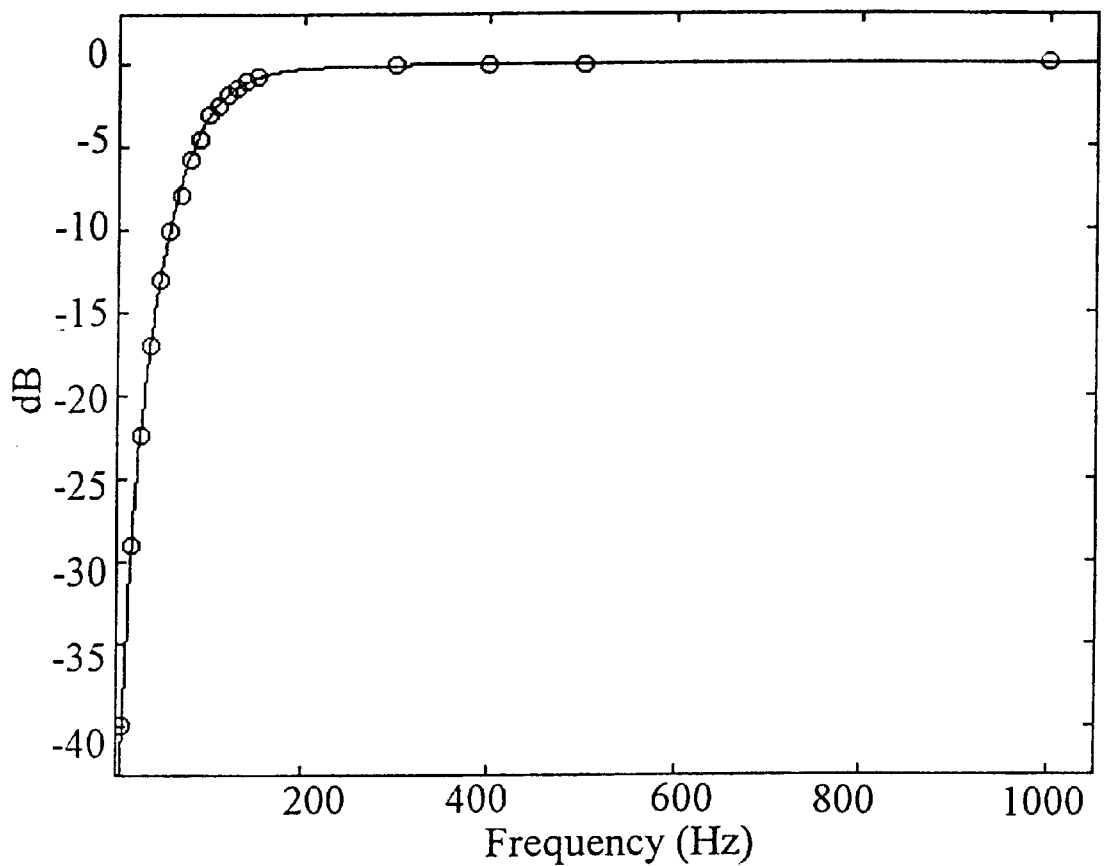
FIG. 6 is a frequency vs. volt plot which shows frequency response of the second-order differential highpass filter shown in FIG. 4.

FIG. 6 is the frequency response of the proposed second-order differential highpass filter shown in FIG. 4. The differential input signals are $V_2$−$V_1$=100 sin 2πft mV, where F is frequency and t is time. The test frequency F was selected between 10 Hz and 1000 Hz, and the test results are represented by the symbol 'o'. It is clear that the output voltage will decrease as the test frequency decreases. The units of the horizontal and vertical axex in FIG. 6 are Hertz (Hz) and dB, respectively. The frequency response of the implementation shown in FIG. 6 is concordant with that of the computer simulation shown in FIG. 2.

It can be readily understood from above that the proposed filters shown in FIGS. 1 and 4 have the functions of second-order highpass filtering and differential amplification.

The second-order differential highpass filter constructed in accordance with the present invention may be fabricated as a single chip IC or part of any other signal processing IC.

Having thus described the present invention, which is now deemed appropriate for Letters Patent is set out in the following appended claims.

What is claimed is:

1. A second-order differential highpass filter comprising a difference amplifier and a feedback processing circuit, said difference amplifier comprising an operational amplifier $OP_1$, and four resistors $R_3$, $R_4$, $R_5$ and $R_6$, wherein $R_4/R_3 = R_6/R_5$, the resistors $R_5$ and $R_3$ are connected to the inverting terminal (−) and the noninverting terminal (+) of the operational amplifier $OP_1$, respectively, so that an input voltage $V_1$ is fed to the inverting terminal (−) of the operational amplifier $OP_1$ via the resistor $R_5$, and another input voltage $V_2$ is fed to the noninverting terminal (+) of the operational amplifier $OP_1$ via the resistor $R_3$, and wherein the output of the operational amplifier $OP_1$ is fed back to the inverting terminal (−) of the operational amplifier $OP_1$ via the resistor $R_6$; and said feedback processing circuit comprising an operational amplifier $OP_2$, two resistors $R_1$ and $R_2$, and two serial capacitors $C_2$ and $C_1$ which are connected with each other in series with a conductive wire, wherein the output of the operational amplifier $OP_2$ is fed back to the inverting terminal (−) of the operational amplifier $OP_2$ via the two serial capacitors $C_1$ and $C_2$, and is connected to the noninverting terminal of the operational amplifier $OP_1$ via the resistor $R_4$, and the noninverting (+) terminal of the operational amplifier $OP_2$ is grounded, and wherein the inverting terminal of the operational amplifier $OP_2$ is connected to the output terminal of the operational amplifier $OP_1$ via the resistor $R_1$, and wherein one terminal of the resistor $R_2$ is connected to the conductive wire and another terminal thereof is grounded.

2. A second-order differential highpass filter comprising an instrumentation amplifier and a feedback processing circuit, said feedback processing circuit comprising an operational amplifier $OP_2$, two resistors $R_1$ and $R_2$, and two serial capacitors $C_2$ and $C_1$ which are connected with each other in series with a conductive wire, wherein the output of the operational amplifier $OP_2$ is fed back to the inverting terminal (−) of the operational amplifier $OP_2$ via the two serial capacitors $C_1$ and $C_2$, and is connected to an reference terminal of the instrumentation amplifier, and the noninverting (+) terminal of the operational amplifier $OP_2$ is grounded, and wherein the inverting terminal of the operational amplifier $OP_2$ is connected to an output terminal of the instrumentation amplifier via the resistor $R_1$, and wherein one terminal of the resistor $R_2$ is connected to the conductive wire and another terminal thereof is grounded.

* * * * *

UNITED STATES PATENT AND TRADEMARK OFFICE
CERTIFICATE OF CORRECTION

PATENT NO : 5,952,878
DATED : September 14, 1999
INVENTOR(S): Chien-Ping Wu, et al.

It is certified that error appears in the above-identified patent and that said Letters Patent is hereby corrected as shown below:

Col. 2, line 62, "OP2" should be -- $OP_2$ --
Col. 2, line 64, "OP2" should be -- $OP_2$ --
Col. 4, line 17, "$C_1 = 123$" should be -- $C_2 = 123$ --
Col. 4, line 17, "$F_o$" should be -- $f_o$ --
Col. 4, line 45, "$F_o$" should be -- $f_o$ --
Col. 4, line 49, "2π500" should be -- 2π30 --
Col. 4, line 50, "27c500t" should be -- 2π500t --
Col. 4, line 60, "F" should be -- f --

Signed and Sealed this

Fourth Day of April, 2000

Q. TODD DICKINSON

*Attest:*

*Attesting Officer*    *Director of Patents and Trademarks*